United States Patent
Choffat et al.

[11] Patent Number: 5,870,793
[45] Date of Patent: Feb. 16, 1999

[54] BRUSH FOR SCRUBBING SEMICONDUCTOR WAFERS

[75] Inventors: Christopher C. Choffat; Justin J. Griffin, both of Phoenix, Ariz.

[73] Assignee: Integrated Process Equipment Corp., Phoenix, Ariz.

[21] Appl. No.: 850,057

[22] Filed: May 2, 1997

[51] Int. Cl.[6] .............................. B08B 1/04; B08B 3/00; B08B 11/00

[52] U.S. Cl. .............................. 15/102; 15/97.1; 15/230; 15/230.16; 15/244.1; 451/530

[58] Field of Search .......................... 15/97.1, 102, 180, 15/187, 188, 230, 230.1, 230.16, 230.19, 244.1, 244.4; 451/526, 527, 530; 401/28, 207

[56] References Cited

U.S. PATENT DOCUMENTS

| | | | |
|---|---|---|---|
| 1,058,273 | 4/1913 | Thompson | 15/188 |
| 2,162,907 | 6/1939 | Bambach | 401/28 |
| 2,480,023 | 8/1949 | Holden | 401/28 |
| 2,829,393 | 4/1958 | Turcotte | 401/207 |
| 3,081,769 | 3/1963 | Ackerman | 401/28 X |
| 3,964,957 | 6/1976 | Walsh | 156/345 |
| 4,031,667 | 6/1977 | Schestedt | 451/258 |
| 4,055,029 | 10/1977 | Kalbow | 451/527 |
| 4,208,760 | 6/1980 | Dexter et al. | 15/302 |
| 4,969,226 | 11/1990 | Seville | 15/244.4 |
| 5,020,200 | 6/1991 | Minasaka et al. | 29/25.01 |
| 5,144,711 | 9/1992 | Gill, Jr. | 15/97.1 |
| 5,156,174 | 10/1992 | Thompson et al. | 134/153 |
| 5,209,760 | 5/1993 | Wiand | 51/293 |
| 5,232,470 | 8/1993 | Wiand | 51/295 |
| 5,317,836 | 6/1994 | Hasegawa et al. | 451/146 |
| 5,320,706 | 6/1994 | Blackwell | 438/693 |
| 5,375,289 | 12/1994 | Miyaoka | 15/230 |
| 5,449,388 | 9/1995 | Wiand | 51/298 |
| 5,489,233 | 2/1996 | Cook et al. | 451/41 |

FOREIGN PATENT DOCUMENTS

| | | | |
|---|---|---|---|
| 721143 | 5/1942 | Germany | 15/180 |
| 13531 | 9/1955 | Germany | 15/187 |
| 203426 | 9/1923 | United Kingdom | 15/188 |
| 444265 | 3/1936 | United Kingdom | 15/244.1 |

*Primary Examiner*—Mark Spisich
*Attorney, Agent, or Firm*—Quarles & Brady

[57] ABSTRACT

A tool for cleaning semiconductor wafers includes a cleaning head with a flat face bounded by an edge. A tubular drive shaft is connected to the cleaning head and provides a conduit through which a cleaning fluid can flow. An opening into the shaft is provided in the flat face which also has a plurality of channels to distribute the cleaning fluid across the flat face. A brush is formed as a single piece of porous, elastic material with a substrate portion that has a first major surface abutting the cleaning head face. A lip of the brush extends from the substrate portion around the edge of the flat face to removably secure the brush to the cleaning head. The brush has a plurality of cylindrical nubs on the second major surface forming projections for scrubbing surfaces of semiconductor wafers.

19 Claims, 2 Drawing Sheets

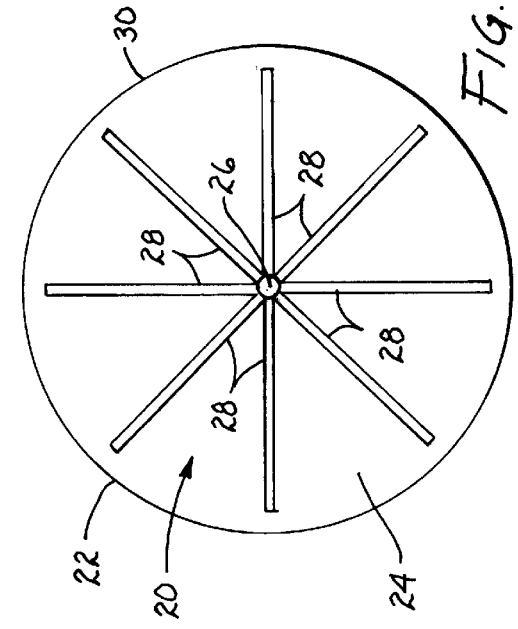
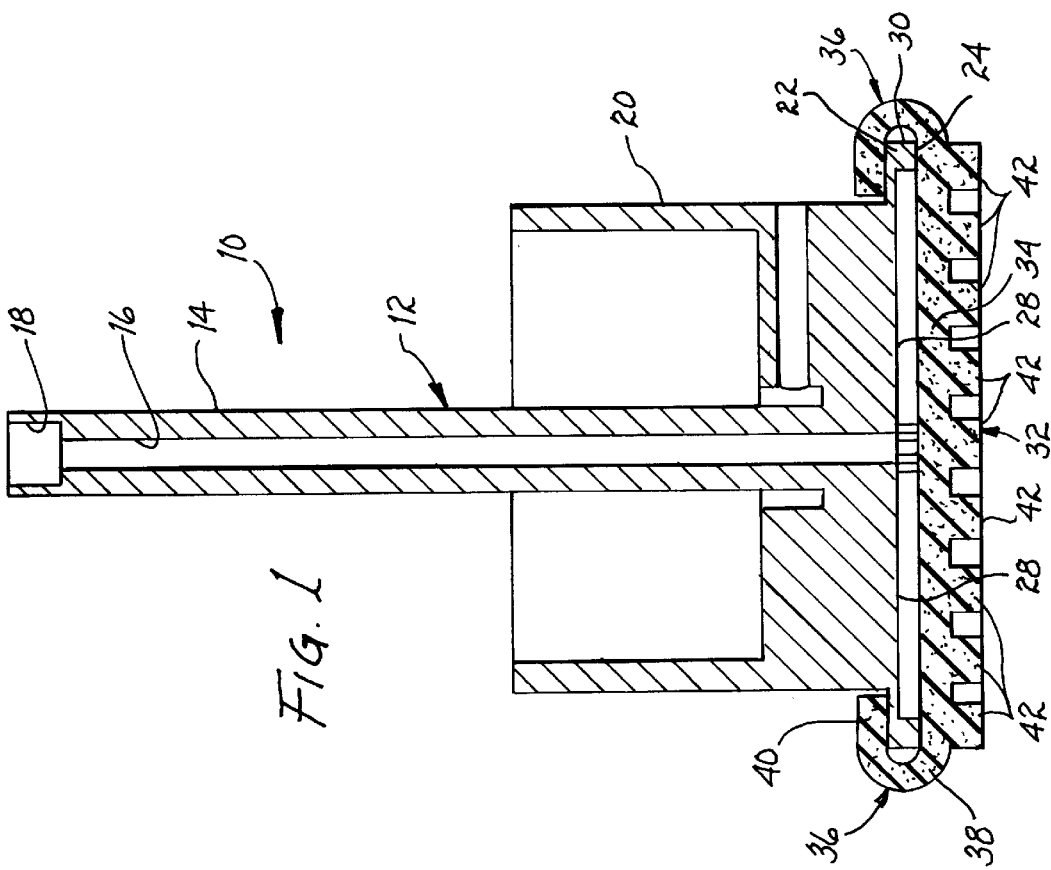

BRUSH FOR SCRUBBING SEMICONDUCTOR WAFERS

BACKGROUND OF THE INVENTION

The present invention relates to semiconductor wafer fabricating equipment; and in particular to apparatus for cleaning the semiconductor wafer during fabrication.

Following chemical-mechanical polishing, a semiconductor wafer often is scrubbed with a "pancake" style pad to remove particles of the polishing slurry left on the surface of the semiconductor wafer. Such flat pancake pads are fixed onto a mounting plate with an adhesive and the mounting plate then is attached to a holder by bolts, machine screws or other mechanical fasteners. The pad is part of a wafer cleaning machine which rotates the mounting plate and pad against the major flat surface of the semiconductor wafer being cleaned. The chemicals used to clean semiconductor wafers may break down the adhesive used to attach the scrubbing pad to the mounting plate, resulting in the pad detaching during the scrubbing operation.

Some of the particulate matter being removed from the semiconductor wafer builds up on the pad over the course of repeated scrubbing operations; thereby necessitating periodic replacement of the pad. The procedure of changing conventional cleaning pads is somewhat time consuming requiring unbolting of the mounting plate from the cleaning machine and stripping the adhesively applied pad from the mounting plate. The scrubbing machine is taken out of operation, during the pad replacement procedure. In addition, use of adhesives to attach the pad can contaminate the cleaning machine, the clean room in which the wafer cleaning occurs and nearby semiconductor wafers.

Therefore, it is desirable to have a semiconductor wafer cleaning tool which resists the build up of particles on its surfaces. It is also desirable to enable easy replacement of the cleaning tool without dismantling the cleaning machinery and without using adhesives and other materials which could contaminate the clean room environment.

Furthermore, conventional pancake style scrubbing pads are not designed to clean the edge of the semiconductor wafer, as opposed to the major flat surface which has been polished. Without assuring that wafer edges will be cleaned, downstream operations in the semiconductor fabrication process may become contaminated with particles riding on the wafer edges. As a consequence, it is desirable to create a cleaning tool which also removes particulate matter from the edge of the semiconductor wafer.

SUMMARY OF THE INVENTION

A general object of the present invention is to provide an assembly for scrubbing a semiconductor wafer to remove particulate matter which accumulated during wafer processing.

Another object is to provide a wafer scrubbing tool with a self-cleaning mechanism to reduce buildup of particles on the tool thereby prolonging its operational life.

A further object of the present invention is to provide a semiconductor wafer cleaning brush that can be removably attached to the cleaning machinery without the use of adhesives or separate mechanical fasteners.

Yet another object is to provide a tool which scrubs the edge of the semiconductor wafer, as well as the major surface.

These and other objectives are satisfied by a tool for an apparatus which cleans semiconductor wafers wherein the tool comprises a brush formed as a single piece of a flexible, elastic material. The brush has a substrate portion with two major surfaces and a lip that projects around one major surface for securing the brush to the scrubbing apparatus. In the preferred embodiment, the lip has a curved portion with one end contiguous with the substrate portion and another end which is contiguous with a flat portion so as to extend around a flange on the scrubbing apparatus.

A plurality of nubs extend from the other major surface of the substrate portion for scrubbing a semiconductor wafer. Preferably the nubs are cylindrical with flat ends that are coplanar.

Another aspect of the present invention is a cleaning head for supporting the brush wherein the cleaning head has a flat face bounded by an edge. The substrate portion of the brush abuts the flat face and the curved portion extends around the edge to secure the brush to the cleaning head. The cleaning head includes a shaft for attaching to a drive mechanism which rotates the cleaning head. That shaft has a longitudinal bore and a coupling for attachment to a source of a cleaning fluid. An opening in the flat face communicates with the bore and channels in the flat face communicate with the opening to distribute the cleaning fluid across the flat face behind the brush.

BRIEF DESCRIPTION OF THE DRAWINGS

FIG. 1 is a cross-sectional view of a semiconductor wafer scrubbing brush, according to the present invention, attached to a mounting plate of the wafer cleaning apparatus;

FIG. 2 is a plane view of the face of the mounting plate;

FIG. 3 is a plane view of a major surface of the scrubbing brush;

DETAILED DESCRIPTION OF THE INVENTION

Figure 4:
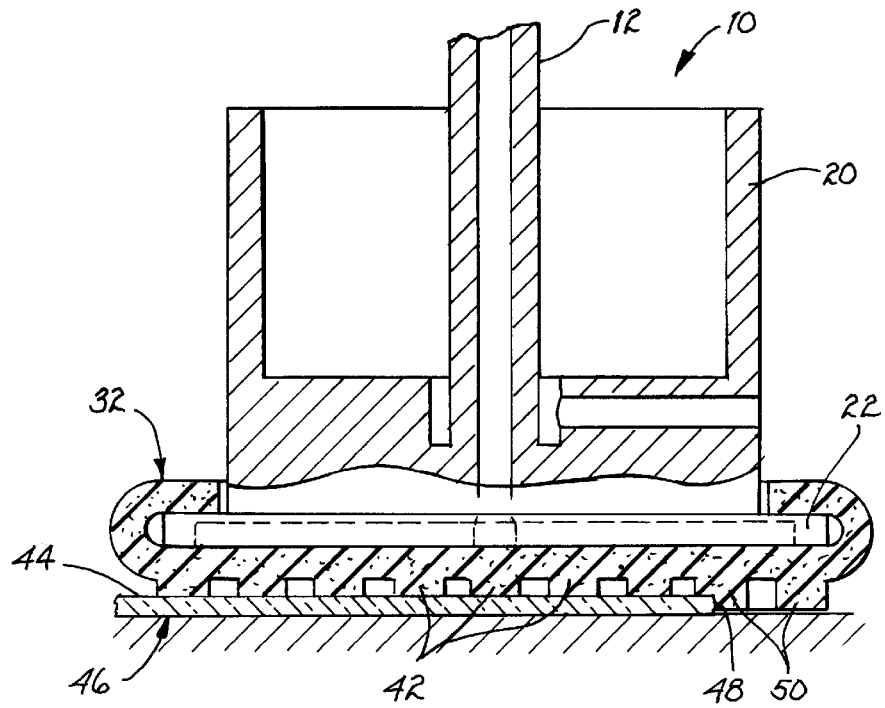
FIG. 4 is a cross-sectional view of the scrubbing brush assembly in contact with a semiconductor wafer.

With initial reference to FIG. 1, a tool assembly 10 for scrubbing semiconductor wafers comprises a mandrel 12 with a shaft 14 that is driven by a motor in a conventional wafer cleaning apparatus, such as an Avanti 9000 model manufactured by IPEC-Planar of Phoenix, Ariz. U.S.A. The mandrel shaft 14 has a longitudinal bore 16 extending therethrough with one end 18 of the bore being threaded to receive a rotary pipe connection which enables fluid to be introduced into the bore 16 while the shaft rotates, as will be described.

The opposite end of the shaft 14 is integral with a cleaning head 20 which has a circular face 24 with an annular flange 22, as shown in FIG. 2. The bore 16 in the shaft 14 communicates with a central opening 26 in the circular face 24. A plurality, e.g. eight, grooves or channels 28 are located in the circular face 24 extending radially from the central opening 26 and terminating a short distance from the circumferential flange edge 30 of the circular face 24.

With reference again to FIG. 1, a scrubbing brush 32 extends over the face of the cleaning head 20 and is attached to the flange 22. The scrubbing brush 32 is molded as a single piece from porous, sponge-like material, such as polyvinyl alcohol (PVA) or polyvinyl alcohol foam. The scrubbing brush 32 has a circular, flat, sheet-like substrate portion 34 which when mounted onto the cleaning head 20 abuts the circular face 24. The substrate portion 34 is surrounded by an annular lip 36 which extends around the edge 30 of the cleaning head flange 22 and curves back toward the longitudinal axis of the tool assembly 10. Specifically, the lip 36 has a semi-circular curved portion 38 which is contiguous with an outer circumferential region of the substrate portion 34. This curved portion 38 has an inner diameter which preferably is slightly less than the thickness of the flange 22 on the cleaning head 20, so that the elastic scrubbing brush 32 is stretched to fit tightly onto the flange. The remote end of the curved portion 38 from the substrate 34 is contiguous with a flat annular portion 40 of the lip 38 which abuts the rear surface of the cleaning head flange 22 that is opposed to the circular face 24.

The lip 36 encircles the flange 22 thereby holding the scrubbing brush 32 on the end of the cleaning head 20. The elastic scrubbing brush 32 is sized so as to be slightly stretched around the flange thereby providing a tight fit which resists movement of the scrubbing brush with respect to the cleaning head 20 during the scrubbing operation when the cleaning head is rotated. Although the elasticity of the lip 36 normally is sufficient to secure the scrubbing brush 32 to the cleaning head 20, it may be desirable to provide an additional mechanical fastener, such as a clip, to hold the lip against the flange 22 in some applications.

The single piece design of scrubbing brush 32 facilitates installation and removal from the cleaning head 20 which can be accomplished without use of tools or operating separate mechanical brush holding devices. The material of scrubbing brush 32 is flexible and elastic allowing the lip 36 to be pulled away from the flange 22 so that the brush may be removed from the cleaning head 20. Specifically, the flat annular section 40 of lip 36 can be pulled upward away from the back surface of the flange 22 allowing the scrubbing brush 32 to be pulled off of the flange, in the downward direction of the orientation in FIG. 1. In a reverse fashion, a new scrubbing brush 32 may have its lip 36 stretched over the flange 22 of the cleaning head 20 and then the lip snaps around the flange into the position illustrated in FIG. 1, thereby attaching the brush to the cleaning head.

Extending perpendicularly outward from the exposed surface of the substrate portion 34 of the scrubbing brush 32 are a plurality of nubs 42 positioned in concentric circles, as shown in FIG. 3. Each nub 42 has a cylindrical shape with a flat exposed end that is substantially coplanar with the exposed ends of the other nubs. In the illustrated embodiment of the present scrubbing brush 32, a central nub is located in the center of the circular substrate portion 34 directly over the opening 26 to the bore 16 through the cleaning head 20. Four concentric circles of nubs 42 are located around the central nub. The nubs 42 are equidistantly spaced around each concentric circle with the larger diameter circles having a corresponding greater number of nubs. Thus the nubs 42 extend across the entire substrate portion 34 of scrubbing brush 32.

Once the scrubbing brush 32 has been attached to the face 24 of the cleaning head 20, the apparatus is ready to process semiconductor wafers. The wafer cleaning equipment rotates the shaft 14 of the tool assembly 10 and moves the assembly against the major flat surface 44 of a semiconductor wafer 46 to be scrubbed as illustrated in FIG. 4. The nubs 42 of the scrubbing brush 32 are forced against the flat surface 44 of the semiconductor wafer 46 while the cleaning head 20 and attached scrubbing brush 32 are rotating. The semiconductor wafer 46 also is spinning beneath the cleaning head 20.

At this time, a cleaning fluid, typically water, is fed through the bore 16 of the shaft 14 from which it flows outward through the channels 28 in the face 24 of the cleaning head 20. This distributes the cleaning fluid across the back surface of the brush substrate 34. Because the brush material is porous, the cleaning fluid flows through the substrate 34 and nubs 42 onto the surface of the semiconductor wafer 46 being cleaned. This flow of cleaning fluid flushes any particles scrubbed off of the surface 44 away from both the semiconductor wafer 46 and the scrubbing brush 32, thereby inhibiting the accumulation of particles on the surface of the scrubbing brush between the nubs 42. Thus, the scrubbing brush has a self-cleaning action.

The elastic nubs 42 of scrubbing brush 32 are compressed against the major flat surface 44 of a semiconductor wafer 46. When the rotating scrubbing brush 32 extends over the edge 48 of the semiconductor wafer 46, some of the nubs 50 beyond that edge expand, downward in FIG. 4. This causes some of the nubs 50 to wipe against the edge 48 of the semiconductor wafer 46 removing particles from that edge. This is in contrast to previous pancake style scrubbing pads, which had a flat surface and did not wipe the semiconductor wafer edge 48.

Figure 5:
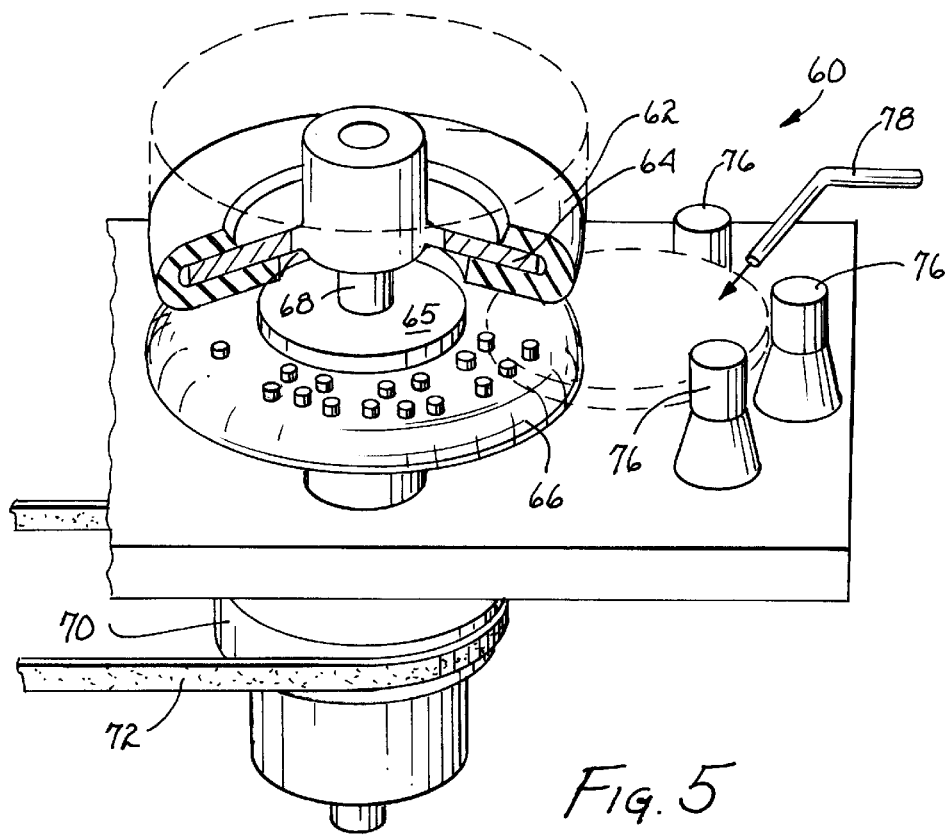
FIG. 5 is an isometric view of an apparatus for cleaning both flat surfaces of a semiconductor wafer.

Referring to FIG. 5, the present scrubbing brush also can be used on dual-brush cleaning apparatus 60, such as the one described in U.S. Pat. No. 5,144,711 which description is incorporated herein by reference. In this type of equipment, a first scrubbing brush 62 is mounted on an upper disk 64 and a second scrubbing brush 66 is mounted on an lower disk 65 with both disks being attached to drive shaft 68. A pulley 70 on the drive shaft is driven by a belt 72 to rotate the shaft and thus both scrubbing brushes 62 and 66.

The upper brush and disk assembly can be raised to allow a semiconductor wafer 74, shown in phantom to be placed between the upper and lower scrubbing brushes 62 and 66. The upper brush and disk assembly then is lowered into the cleaning position shown in FIG. 5. In this position the exposed portion of semiconductor wafer 74 is supported by three vertical rollers 76 while water from tube 78 is directed onto the wafer.

Between cleaning operations, scrubbing brushes 62 and 66 may be brought into contact with each other to remove particles from their surfaces thus providing a self-cleaning action.

We claim:

1. A tool for an apparatus which cleans semiconductor wafers comprising a brush formed as a single piece of porous, flexible, elastic material, and having a substrate portion with first and second major surfaces and having a lip for securing the brush to the apparatus, the lip extending around and projecting from the first major surface and a plurality of projections of a pre-defined shape extending from the second major surface, and said first major surface adapted to abut a portion of said apparatus when mounted thereon.

2. The tool as recited in claim 1 wherein the material of the brush is selected from a group consisting of polyvinyl alcohol and polyvinyl alcohol foam.

3. The tool as recited in claim 1 wherein each of the plurality of projections has a cylindrical shape.

4. The tool as recited in claim 1 wherein each of the plurality of projections has a cylindrical shape with a flat exposed end, wherein the flat exposed ends of the plurality of projections are coplanar.

5. The tool as recited in claim 1 wherein the plurality of projections are arranged in concentric circles on the second major surface.

6. The tool as recited in claim 1 wherein the substrate portion is circular; and the lip is annular and curves away from the first major surface.

7. The tool as recited in claim 1 wherein the lip has a flat portion and a curved portion between the flat portion of the lip and the substrate portion.

8. The tool as recited in claim 7 further comprising a cleaning head with a flat face bounded by an edge; wherein the substrate portion of the brush extends across the flat face and the curved portion extends around the edge to secure the brush to the cleaning head.

9. The tool as recited in claim 7 wherein the curved portion of the lip is semi-circular.

10. A tool for an apparatus which cleans semiconductor wafers comprising:

a cleaning head having a flat face bounded by an edge;

a brush formed as a single piece of porous, flexible, elastic material, having a substrate portion with a first major surface abutting the face of the cleaning head and having a lip extending from the substrate portion and around the edge to attach the brush to the cleaning head, the brush including a plurality of projections extending from a second major surface for scrubbing the semiconductor wafers.

11. The tool as recited in claim 10 wherein the plurality of projections are arranged in concentric circles on the second major surface.

12. The tool as recited in claim 10 wherein each of the plurality of projections has a cylindrical shape.

13. The tool as recited in claim 10 wherein each of the plurality of projections has a cylindrical shape with a flat exposed end wherein the flat exposed ends of the plurality of projections are coplanar.

14. The tool recited in claim 10 wherein the cleaning head has a plurality of channels in the flat face for conducting a fluid.

15. The tool as recited in claim 10 wherein the cleaning head includes a shaft for attaching to a drive mechanism which rotates the cleaning head, the shaft having a longitudinal bore with a connector for attachment to a source of a cleaning fluid; an opening in the flat face which communicates with the bore; and a plurality of channels in the flat face which communicates with the opening.

16. The tool as recited in claim 10 further wherein the lip has a flat portion and a curved portion between the flat portion of the lip and the substrate portion, wherein the curved portion extends around the edge to secure the brush to the cleaning head.

17. An apparatus for cleaning semiconductor wafers, said apparatus comprising;

a first cleaning disk coupled to a shaft for rotational movement and having a first flat face bounded by an edge;

a second cleaning disk coupled to the shaft for rotational movement, and having a second flat face bounded by an edge and facing the first flat face;

first and second brushes each attached to a different one of the first and second cleaning disks, wherein each of the first and second brushes being formed as a single piece of porous, flexible, elastic material having a substrate portion with a first major surface abutting the face of a cleaning disk and having a lip extending from the substrate portion and around the edge to attach the brush to the cleaning disk, each of the first and second brushes further including a plurality of projections of a predefined shape extending from a second major surface for scrubbing the semiconductor wafers.

18. The apparatus as recited in claim 17 wherein each of the plurality of projections has a cylindrical shape with a flat exposed end with the flat exposed ends of the plurality of projections being coplanar.

19. The apparatus as recited in claim 17 further wherein the lip has a flat portion and a curved portion between the flat portion of the lip and the substrate portion, wherein the curved portion extends around the edge of one of the first and second cleaning disks.

* * * * *